Nov. 22, 1966 D. J. POPPY 3,287,644
AUTOMATIC GAIN CONTROLLED PLURAL WAVE BAND RADIO RECEIVER
Filed May 20, 1963
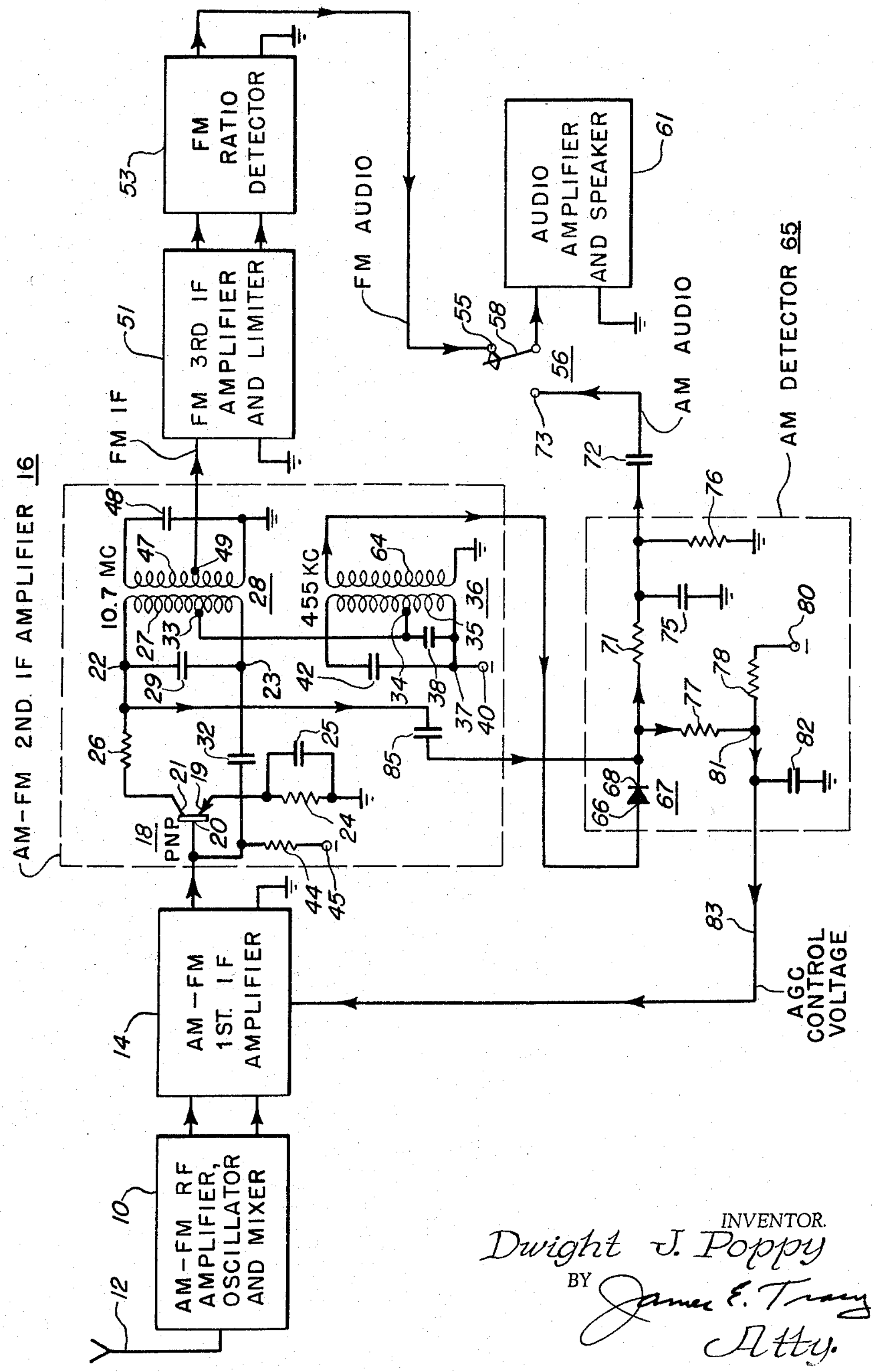
INVENTOR.
Dwight J. Poppy
BY James E. Tracy
Atty.

United States Patent Office 3,287,644
Patented Nov. 22, 1966

3,287,644

AUTOMATIC GAIN CONTROLLED PLURAL WAVE BAND RADIO RECEIVER

Dwight J. Poppy, Chicago, Ill., assignor to Zenith Radio Corporation, Chicago, Ill., a corporation of Delaware Filed May 20, 1963, Ser. No. 281,575
7 Claims. (Cl. 325—316)

This invention relates in general to an arrangement for developing automatic gain control (AGC) voltages in a plural wave band radio receiver. The invention is especially but not exclusively applicable to an AGC system in a superheterodyne radio receiver capable of selectively receiving either amplitude modulated (AM) carrier waves lying in the AM broadcast band or frequency modulated (FM) carrier waves of the FM broadcast band.

To develop control voltages for automatically controlling the gain of a plural wave band receiver it is usually necessary to employ switching contacts controlled by the band switch. When the band switch is operated by the user to select a different wave band, switch contacts are actuated to selected a different point in the circuit from which to derive an AGC control potential. For example, in many AM-FM radio receivers it is conventional to employ switching contacts in the AM-FM band switch for deriving the AGC voltage from the AM detector, when tuned to AM, and from the FM detector when tuned to FM. In many cases, a plurality of unidirectional conductive devices, such as diodes, are required to produce the different AGC control potentials from the different wave bands.

The present application provides a novel arrangement, requiring a minimum of circuitry, for deriving AGC potentials in a plural band receiver, and yet this is achieved without the use of any switches. Obviously, eliminating switching contacts, without substituting therefor an elaborate complex circuit, not only represents a cost savings in manufacturing but removes a source of potential trouble during the life of the receiver. Switch contacts are subject to malfunctioning since they at times become "dirty" or corroded.

It is, accordingly, an object of the present invention to provide an improved automatic gain control system for a plural wave band radio receiver.

It is another object to provide a novel switchless, AGC system for a plural wave band, superheterodyne radio receiver.

A further object of the invention is to provide a new and improved AGC arrangement for an AM-FM broadcast receiver.

A plural wave band radio receiver, constructed in accordance with the invention, utilizes a first carrier wave amplitude-modulated with audio information and having a carrier frequency lying within a first wave band, and also utilizes a second carrier wave modulated with audio information and having a carrier frequency lying within a second wave band above the first wave band in the frequency spectrum. The receiver comprises a first amplifying channel for developing, during a certain interval and in response to the reception of the first carrier wave, an amplitude-modulated carrier signal having a predetermined carrier frequency and having a peak amplitude determined by the strength of the first carrier wave. There is a second amplifying channel for developing, during another interval and in response to the reception of the second carrier wave, a modulated carrier signal having a carrier frequency which is higher than the predetermined carrier frequency and having a peak amplitude determined by the strength of the second carrier wave.

An amplitude modulation detector, including only one unidirectional conductive device, is coupled to the first amplifying channel and includes an audio output circuit for developing, during the afore-mentioned certain interval and in response to the amplitude-modulated carrier signal, an audio signal representing the audio information carried by the first carrier wave. The AM detector also includes a filter network for developing a unidirectional or D.C. control potential of a magnitude determined by the average peak amplitude of the amplitude-modulated carrier signal. Coupling means, including a capacitor, is coupled to the second amplifying channel and to the unidirectional conductive device for applying, during the other interval, the modulated carrier signal to the amplitude modulation detector to produce in the filter network a D.C. control potential of a magnitude determined by the average peak amplitude of the modulated carrier signal. The capacitor presents a relatively high impedance at the predetermined carrier frequency to effectively decouple the second amplifying channel from the amplitude modulation detector during the reception of the first carrier wave. Finally, the radio receiver comprises means for utilizing the D.C. control potentials to automatically control its gain.

The features of this invention which are believed to be new are set forth with particularity in the appended claims. The invention, together with further objects and advantages thereof, may best be understood, however, by reference to the following description taken in conjunction with the accompanying drawing, the single figure of which illustrates an AM-FM superheterodyne transistorized radio receiver constructed in accordance with one embodiment of the invention.

Turning now to a structural description of the illustrated AM-FM receiver, there is a conventional transistorized tuner 10 which includes a radio-frequency amplifier, a local oscillator, and a mixer. By means of a switching arrangement (not shown), to be actuated by an AM-FM band switch control knob accessible to the user, tuner 10 may be conditioned to selectively utilize either amplitude-modulated carrier waves in the AM broadcast band (540–1600 kilocycles) or frequency-modulated carrier waves in the FM wave band (88–108 megacycles). If desired, tuner 10 may essentially comprise two complete tuners, one for AM and one for FM. For obvious economy reasons, it is desirable that the three stages included in tuner 10 be capable of functioning for either AM or FM reception.

The input to the radio-frequency amplifier section of tuner 10 is coupled to a receiving antenna 12 and the output of the mixer section is coupled to an AM-FM first intermediate-frequency (IF) amplifier 14. When tuner 10 is adjusted to receive an amplitude-modulated carrier wave in the AM wave band, an amplitude modulated intermediate-frequency signal is produced in the tuner, in conventional superheterodyne fashion, for application to first IF amplifier 14. In the particular illustrated embodiment, the intermediate frequency for AM reception preferably is 455 kilocycles (kc.). On the other hand, when tuner 10 is adjusted by the user to receive a frequency-modulated carrier wave in the FM band, a frequency-modulated intermediate-frequency signal is produced in the output of the tuner for translation to first IF amplifier 14. In the illustrated case the IF for frequency modulation reception preferably is 10.7 megacycles, which is considerably higher than the intermediate frequency for AM reception.

First IF amplifier 14 preferably includes only a single amplifying device in the form of a PNP transistor (not shown) and is capable of relatively wide band amplification in order that it may amplify both the amplitude-modulated IF and the frequency-modulated IF signals. This may be achieved, in accordance with one well known technique, by employing a pair of series-connected tuned circuits, tuned to the AM and FM intermediate frequencies respectively, in the input of the transistor and another pair of series-connected tuned circuits, respectively tuned to the AM and FM IF's, in the output of the transistor in amplifier 14.

The output of first IF amplifer 14 is connected to the input of an AM-FM second IF amplifier 16, shown in complete schematic detail in the drawing. Specifically, amplifier 16 includes a PNP junction type transistor 18 having an emitter 19, a base 20 and a collector 21. One of the output terminals of first IF amplifer 14 is connected to base 20, while the other output terminal is connected to a plane of reference potential such as ground. Emitter 19 is also coupled to ground by means of a bias resistor 24 which is shunted by a capacitor 25. Collector 21 is coupled through a resistor 26 to the upper terminal 22 of an inductance-capacitance, parallel resonant tuned circuit comprising the primary winding 27 of an IF coupling transformer 28 and a shunt-connected capacitor 29. The lower terminal 23 of tuned circuit 27, 29 is coupled by way of a neutralizing condenser 32 to base 20. A tap 33 along primary winding 27 is connected to a tap 34 along the primary winding 35 of a second IF coupling transformer 36. A capacitor 42 is coupled across primary winding 35 to provide another inductance-capacitance parallel resonant tuned circuit, the lower terminal 37 of which is connected to a negative source of unidirectional operating potential 40. A capacitor 38 is coupled between tap 34 and lower terminal 37 and forms part of the capacitance of the tuned circuit. Base 20 is also coupled, via a bias resistor 44, to a negative source of unidirectional operating potential 45. Of course, sources 40 and 45 may be the same and may be provided by a single battery. In fact, the very same battery may be utilized to energize every stage in the illustrated receiver.

The parameters of tuned circuit 27, 29 are selected so that the circuit is tuned to the FM intermediate frequency (10.7 mc.). Another parallel resonant tuned circuit, comprising the secondary winding 47 of transformer 28 and a shunting condenser 48, is also tuned to the 10.7 megacycles FM IF. The lower terminal of tuned circuit 47, 48 is grounded and a tap 49 along winding 47 is coupled to one input of a third IF amplifier and limiter 51, the other input terminal of which is connected to ground. The two output terminals of unit 51 are respectively connected to the two input terminals of a frequency modulation detector 53, which may take any of a variety of different forms. For example, it may comprise a conventional discriminator. In the illustrated embodiment of the invention, however, it is preferred that FM detecor 53 comprises a conventional ratio detector.

One output terminal of detector 53 is grounded while the other is connected to a fixed contact 55 of a switch 56, shown for convenience as merely a single-pole double-throw switch. Of course, it is contemplated that switch 56 may be provided by switch contacts which are incorporated in the AM-FM band switch. As mentioned previously, in the described embodiment the operation of the RF amplifier, the local oscillator and the mixer included in tuner 10 is changed by manipulation of the band switch.

The movable contact 58 of AM-FM switch 56 is coupled to one input terminal of an audio amplifier, the other input of which is grounded. The audio amplifier may include any desired number of amplification stages. Preferably, it includes a driver stage to the output of which is coupled a push-pull amplifier. The output of the audio amplifier is in turn coupled to a speaker. For convenience, the audio amplifier and speaker have been shown in the drawing by means of a single block 61.

The parameters of tuned circuit 35, 38, 42 are chosen so that the circuit resonates at the intermediate frequency (455 kilocycles) for AM reception. The tuned circuit is inductively coupled by means of the secondary winding 64 of transformer 36 to an amplitude modulation detector 65. More particularly, the lower terminal of secondary winding 64 is grounded while its upper terminal is coupled to one terminal, specifically the anode terminal 66, of a unidirectional conductive device in the form of a diode 67. The other or cathode terminal 68 of diode 67 is coupled by means of a resistor 71 and a series-connected capacitor 72 to the other fixed contact 73 of AM-FM switch 56. The junction of resistor 71 and condenser 72 is coupled to ground through a capacitor 75 and also through a D.C. load resistor 76. Resistors 71 and 76 and condenser 75 collectively constitute an audio output circuit in the form of an audio detection filter. Resistor 76 also provides a D.C. load for diode 67. Capacitor 72 is merely a D.C.-blocking coupling capacitor.

The junction of cathode 68 and resistor 71 is coupled through series-connected resistors 77 and 78, in the order named, to a negative source of unidirectional operating potential 80, which source may be the same as 40 and 45 as suggested earlier.

The junction 81 of resistors 77 and 78 is coupled to ground through a capacitor 82 and is also coupled, via a conductor 83, to another input of first IF amplifier 14. Specifically, conductor 83 is preferably coupled through the two series-connected tuned circuits in the input of the PNP transistor in amplifier 14 in order that junction 81 may be D.C.-connected to the base of the transistor through the two inductance coils of the resonant circuits. Resistor 77 in conjunction with condenser 82 provide an automatic gain control filter, while resistor 78 constitutes a bias resistor for diode 67, and also for the PNP type transistor in first IF amplifier 14.

The upper terminal 22 of tuned circuit 27, 29 is coupled through a capacitor 85 to cathode 68 of diode 67. The condenser has a capacitance of such a value (preferably about 7 micro-microfarads) that it presents a relatively high impedance at the intermediate frequency (455 kc.) for AM reception. In this way, tuned circuit 27, 29 is effectively decoupled from amplitude modulation detector 65 during the reception of amplitude-modulated carrier waves.

Consideration will now be given to the operation of the illustrated AM-FM receiver. Each of the various transistor stages is provided with a slight forward bias. Negative source 80 applies a negative bias potential by way of resistor 78 to the base of the PNP transistor in amplifier 14 in order that the base may be established at a potential which is slightly negative to that at which the emitter is established thereby to effect forward biasing of the transistor in first IF amplifier 14. Negative source 40 is D.C. connected, by way of the portion of primary winding 35 below tap 34, the conductor between taps 34 and 33, the portion of winding 27 above tap 33 and resistor 26, to collector 21 in order to provide an operating potential for IF amplifier 16. Negative potential source 45 applies a negative potential to base 20 by way of bias resistor 44 in order that base 20 may be made slightly negative with respective to emitter 19 thereby to forward bias transistor 18. Negative potential source 80 also applies a negative potential, by way of resistors 78 and 77, to cathode 68 of diode 67 in order to forward bias the diode so that it is normally conductive, current flowing from ground through secondary winding 64, diode 67, and resistors 77 and 78 to negative potential source 80.

When it is desired to tune the receiver to an AM transmitting station, the user manipulates the AM-FM band switch to the AM position and then adjusts the tuning control so that tuner 10 is positioned to the desired AM station. Tuner 10 functions in conventional manner to produce it, at its output terminals and in response to the reception of the selected amplitude-modulated carrier wave, an amplitude-modulated intermediate-frequency signal having an intermediate frequency of 455 kilocycles. First IF amplifier 14 in turn amplifies the amplitude-modulated IF signal and applied the amplified version to base 20 of transistor 18 in second IF amplifier 16. Transistor 18 imparts additional amplification-modulated IF signal and produces in its output circuit a further amplified version of the AM IF. Since tuned circuit 35, 38, 42 resonates at the AM IF, substantially the entire amplified signal is developed across that tuned circuit. The portion of winding 27 above tap 33 presents a very low impedance at 455 kc. Resistor 26 is relatively small, preferably only about 120 ohms, and is provided to suppress parasitic oscillations. Hence, the load circuit for transistor 18 during AM reception comprises primarily resonant circuit 35, 38, 42. Capacitor 32 effects neutralizing in conventional fashion in order to suppress undesired oscillations.

The amplitude-modulated IF signal is produced across secondary winding 64, by transformer action, and is in turn applied across the series circuit comprising diode 67, resistor 71 and the parallel combination of condenser 75 and resistor 76. As mentioned previously, during AM reception capacitor 85 has such a high impedance that it effectively presents an open circuit. Diode 67 conducts only in response to the positive half cycles of the AM IF thereby rectifying the one-half of the amplitude-modulated IF signal which is positive with respect to its A.C. axis. Audio detection filter 71, 75, 76 exhibits an appropriate time constant so that the intermediate-frequency component (455 kc.) is suppressed or filtered out while at the same time the considerably lower frequencies of the audio signal are translated to condenser 72. Preferably, the appropriate time constant is obtained by providing resistors 71 and 76 with resistances of 470 ohms and 5000 ohms, respectively, and condenser 75 with a capacitance of .02 microfarad.

Hence, the audio signal developed across capacitor 75 and resistor 76 represents the audio information carried by the selected AM carrier wave except that it has a positive D.C. or unidirectional component as a result of the half wave rectification effected by diode 67. That D.C. component is effectively removed by D.C. blocking condenser 72 so that only the audio signal is translated through fixed contact 73 and movable contact 58 of switch 56 (the switch, of course, being so positioned for AM reception) to the input of the audio amplifier and speaker 61 wherein the audio signal is amplified and converted into an acoustic signal in normal fashion.

Of course, the peak amplitude of the amplitude-modulated intermediate-frequency signal is determined by, and is proportional to, the strength of the received AM carrier wave. In other words, the stronger received carrier wave, the greater will be the peak amplitude of the AM IF developed across tuned circuit 35, 42, 38. Since diode 67 rectifies the positive half of the AM IF, the positive D.C. or unidirectional component in the signal found at cathode 68 of the diode has a magnitude which is determined by the average peak amplitude of the amplitude-modulated IF signal. This positive D.C. component is effectively detected by the automatic gain control filter comprising resistor 77 and condenser 82. Junction 81 produces a D.C. control potential whose magnitude represents the D.C. component of the rectified AM IF. In other words, units 77 and 82 exhibit a time constant sufficiently long that not only is the 455 kc. component eliminated but the audio component is also removed while at the same time the output D.C. potential of the AGC filter reflects changes in the average peak amplitude of the AM IF signal. Preferably, an appropriate time constant is realized by providing resistor 77 with a resistance of 15,000 ohms and capacitor 82 with a capacitance of 5 microfarads.

A D.C. potential is therefore developed at junction 81 of resistor 77 and capacitor 82 which undergoes changes in magnitude in response to variations in the average peak amplitude of the received carrier wave. Since the negative voltage from source 80 is also applied to junction 81, the net voltage at that junction is determined by the fixed negative voltage from source 80 and the positive D.C. voltage detected by the AGC filter. The base of the PNP transistor in IF amplifier 14 should be negative with respect to ground. Hence, the net voltage at junction 81 exhibits a negative polarity at all times. If the strength of the received carrier wave increases, the potential at junction 81 changes in a positive direction, namely the junction becomes less negative. The positive going voltage at junction 81 is applied, via the D.C. connection which includes conductor 83, to the base of the PNP transistor in IF amplifier 14 to reduce the gain of the transistor in well known manner in order to automatically adjust the amplification to which the received carrier wave is subjected so that the increase in signal strength is compensated by a decrease in amplification. On the other hand, if the received AM carrier wave decreases in strength the control voltage developed at junction 81 changes in a negative sense, namely becomes more negative. As a consequence, the base of the PNP transistor in amplifier 14 becomes more negative with respect to its emitter thereby to increase the gain of the first IF amplifier to compensate for the decrease in strength of the incoming carrier wave.

Of course, the D.C. control potential developed at junction 81 may be utilized in a variety of different ways to automatically control the gain of the radio receiver. The described arrangement is merely one preferred way in which automatic gain control may be achieved. Moreover, it is obvious that while only the first IF amplifier is gain controlled, the AGC control voltage may also be applied to any other appropriate stage to also control the gain of those stages. For example, the AGC control voltage may be applied to the transistor in the RF amplifier and/or the transistor in the mixer for gain control purposes.

For FM reception, the band switch is switched to the FM position, in order to convert tuner 10 for FM operation, and to position movable contact 58 to connect with fixed contact 55. The desired transmitting station within the FM wave band is tuned in by the user and tuner 10 responds thereto to supply to the input of first IF amplifier 14 a frequency-modulated intermediate-frequency signal having an intermediate frequency of 10.7 megacycles. Condenser 38 effectively provides a by-pass or a very low impedance for 10.7 megacycles; preferably, it exhibits a capacitance of 390 micro-microfarads. As mentioned before, resistor 26 is relatively small. Consequently, resonant circuit 27, 29, which is tuned to 10.7 megacycles, effectively constitutes the entire load circuit for transistor 18 during FM reception. The amplified FM IF signal developed by transistor 18 is therefore produced primarily in tuned circuit 27, 29. Resonant circuit 47, 48, which is also tuned to the FM IF, produces a replica signal of the FM IF signal developed in resonant circuit 27, 29 and applies this replica signal to FM third IF amplifier and limiter 51 for additional amplification and for limiting. The audio information carried by the FM IF signal is detected in ratio detector 53 and the resulting audio signal is applied through contacts 55 and 58 to unit 61 for conversion to an acoustic signal.

As in the case of the received AM carrier wave, the frequency-modulated intermediate-frequency signal developed in tuned circuit 27, 29 has a peak amplitude which is proportional to the strength of the received FM carrier wave. While capacitor 85 exhibits a high impedance for 455 kilocycles, it presents a very low impedance for the FM IF, 10.7 megacycles. As a consequence, during FM reception, tuned circuit 27, 29 is coupled to cathode 68 of diode 67 in order to apply the FM IF signal to amplitude modulation detector 65. Due to the presence of capacitor 38, tuned circuit 35, 38, 42 reflects an impedance to inductance coil 64, during frequency modulation reception, which is relatively low. In this way, inductance coil 64 exhibits a relatively low impedance at 10.7 mc. so that anode 66 of unidirectional conductive device 67 is effectively connected to ground. Since the oscillator in tuner 10 has been conditioned to oscillate at an appropriate frequency to produce a 10.7 megacycle IF, there is no 455-kc. signal in tuned circuit 35, 38, 42 during the reception of FM.

Thus, the only signal applied to cathode 68 is the frequency-modulated IF signal. While the peak amplitude of that signal does not vary in accordance with audio information, as in the case with the AM IE, the peak amplitude does change with the strength of the received FM carrier wave. AGC filter network 77, 82 detects the signal strength changes in that its produces a D.C. control potential at junction 81 which is of a magnitude determined by the average peak amplitude of the frequency-modulated IF signal. This control voltage is employed to control the gain of the receiver in exactly the same fashion as the AGC control voltage developed during AM reception adjusted the receiver gain.

The electrical size of resistor 71 is selected so that its resistance is sufficiently high that cathode 68 of diode 67 is not essentially grounded through condenser 75 during FM reception. Of course, the connections to taps 33, 49 and 34 of windings 27, 47 and 35, respectively, have been provided so that appropriate impedances are established to achieve optimum performance.

It is apparent that the invention is not limited to an AM-FM radio receiver, but may find application generally in any apparatus for selectively receiving radiated signals in widely separated frequency ranges. Thus, for example, the invention may be employed in receivers for amplitude-modulated short wave signals in one or more of the short wave bands, in addition to AM standard boradcast signals.

It is also apparent that the invention is not limited to a superheterodyne type radio receiver having different intermediate frequencies for the respective wave bands. For example, a receiver embodying the invention may be of the tuned-radio-frequency (TRF) type in which the received carrier signals for the different wave bands are translated all the way to the audio detectors without converting them to intermediate-frequency signals.

Moreover, while the frequency-modulated IF signal is derived from second IF amplifier 16 for application to AM detector 65, in the illustrated case, it is obvious that the same signal may be derived from any of several other points in the receiver. For example, it may be derived from the mixer, from first IF amplifier 14 or even from third IF amplifier 51. No matter from where it is picked off, its peak amplitude will still represent, and will be proportional to, the strength of the received FM carrier wave.

The invention provides, therefore, an improved automatic gain control system for a plural wave band radio receiver.

While a particular embodiment of the invention has been shown and described, modifications may be made, and it is intended in the appended claims to cover all such modifications as may fall within the true spirit and scope of the invention.

I claim:

1. A plural wave band radio receiver for utilizing a first carrier wave amplitude-modulated with audio information and having a carrier frequency lying within a first wave band, and for also utilizing a second carrier wave modulated with audio information and having a carrier frequency lying within a second wave band above said first wave band in the frequency spectrum, comprising:

a first amplifying channel having a first tuned circuit for developing thereacross, during a certain interval and in response to the reception of said first carrier wave, an amplitude-modulated carrier signal having a predetermined carrier frequency and having a peak amplitude determined by the strength of said first carrier wave;

a second amplifying channel having a second tuned circuit for developing thereacross, during another interval and in response to the reception of said second carrier wave, a modulated carrier signal having a carrier frequency which is higher than said predetermined carrier frequency and having a predetermined peak amplitude determined by the strength of said second carrier wave;

an amplitude modulation detector, including only one unidirectional conductive device, coupled to said first tuned circuit and including an audio output circuit for developing, during said certain interval and in response to said amplitude-modulated carrier signal, an audio signal representing the audio information carried by said first carrier wave, and including a filter network for developing a D.C. control potential of a magnitude determined by the average peak amplitude of said amplitude-modulated carrier signal;

means, including a capacitor, coupling said second, tuned circuit to said unidirectional conductive device for applying, during said other interval said modulated carrier signal with substantially said same predetermined peak amplitude to said amplitude modulation detector to produce in said filter network a D.C. control potential of a magnitude determined by the average peak amplitude of said modulated carrier signal, said capacitor presenting a relatively high impedance at said predetermined carrier frequency to effectively decouple said second tuned circuit from said amplitude modulation detector during the reception of said first carrier wave;

and means for utilizing said D.C. control potentials to automatically control the gain of said radio receiver.

2. A plural wave band, superheterodyne radio receiver for utilizing a first carrier wave amplitude-modulated with audio information and having a carrier frequency lying within a first wave band, and for also utilizing a second carrier wave modulated with audio information and having a carrier frequency lying within a second wave band above said first wave band in the frequency spectrum, comprising:

a first amplifying channel having a first parallel resonant tuned circuit for developing thereacross, during a certain interval and in response to the reception of said first carrier wave, an amplitude-modulated intermediate-frequency signal having a predetermined intermediate frequency and having a peak amplitude determined by the strength of said first carrier wave;

a second amplifying channel having a second parallel resonant tuned circuit for developing thereacross, during another interval and in response to the reception of said second carrier wave, a modulated intermediate-frequency signal having an intermediate frequency which is higher than said predetermined intermediate frequency and having a predetermined peak amplitude determined by the strength of said second carrier wave;

an amplitude modulation detector, including only one unidirectional conductive device, coupled to said first parallel resonant tuned circuit and including an audio output circuit for developing, during said certain interval and in response to said amplitude-modulated intermediate-frequency signal, an audio signal representing the audio information carried by said first carrier wave, and including a filter network for developing a D.C. control potential of a magnitude determined by the average peak amplitude of said amplitude-modulated intermediate-frequency signal;

a capacitor coupling said second parallel resonant tuned circuit to said unidirectional conductive device for applying, during said other interval, said modulated intermediate-frequency signal with substantially said same predetermined peak amplitude to said amplitude modulation detector to produce in said filter network a D.C. control potential of a magnitude determined by the average peak amplitude of said modulated intermediate-frequency signal, said capacitor presenting a relatively high impedance at said predetermined intermediate frequency to effectively decouple said second parallel resonant tuned circuit from said amplitude modulation detector during the reception of said first carrier wave;

and means for utilizing said D.C. control potentials to automatically control the gain of said radio receiver.

3. A plural wave band, superheterodyne radio receiver for utilizing a first carrier wave amplitude-modulated with audio information and having a carrier frequency lying within a first wave band, and for also utilizing a second carrier wave frequency-modulated with audio information and having a carrier frequency lying with a second wave band above said first wave band in the frequency spectrum, comprising:

a first amplifying channel having a first tuned circuit for developing thereacross, during a certain interval and in response to the reception of said first carrier wave, an amplitude-modulated intermediate-frequency signal having a predetermined intermediate frequency and having a peak amplitude determined by the strength of said first carrier wave;

a second amplifying channel having a second tuned circuit for developing thereacross, during another interval and in response to the reception of said second carrier wave, a frequency-modulated intermediate-frequency signal having an intermediate frequency which is higher than said predetermined intermediate frequency and having a predetermined peak amplitude determined by the strength of said second carrier wave;

an amplitude modulation detector, including only one unidirectional conductive device, coupled to said first tuned circuit and including an audio output circuit for developing, during said certain interval and in response to said amplitude-modulated intermediate-frequency signal, an audio signal representing the audio information carried by said first carrier wave, and including a filter network for developing a D.C. control potential of a magnitude determined by the average peak amplitude of said amplitude-modulated intermediate-frequency signal;

means, including a capacitor, coupling said second tuned circuit to said unidirectional conductive device for applying, during said other interval, said frequency-modulated intermediate-frequency signal with substantially said same predetermined peak amplitude to said amplitude modulation detector to produce in said filter network a D.C. control potential of a magnitude determined by the average peak amplitude of said frequency-modulated intermediate-frequency signal, said capacitor presenting a relatively high impedance at said predetermined intermediate frequency to effectively decouple said second tuned circuit from said amplitude modulation detector during the reception of said first carrier wave;

and means for utilizing said D.C. control potentials to automatically control the gain of said radio receiver.

4. A plural wave band, superheterodyne radio receiver for utilizing a first carrier wave amplitude-modulated with audio information and having a carrier frequency lying within a first wave band, and for also utilizing a second carrier wave frequency-modulated with audio information and having a carrier frequency lying within a second wave band above said first wave band in the frequency spectrum, comprising:

an intermediate-frequency amplifier including a first parallel resonant circuit across which is developed, during a certain interval and in response to the reception of said first carrier wave, substantially the entire output signal of the amplifier and constituting an amplitude-modulated intermediate-frequency signal having a predetermined intermediate frequency and having a peak amplitude determined by the strength of said first carrier wave, and further including a second parallel resonant tuned circuit, across which is developed, during another interval and in response to the reception of said second carrier wave, substantially the entire output signal of the amplifier and constituting a frequency-modulated intermediate-frequency signal having an intermediate frequency which is substantially higher than said predetermined intermediate frequency and having a predetermined peak amplitude determined by the strength of said second carrier wave;

an amplitude modulation detector, including only one diode coupled to said first parallel resonant tuned circuit and including an audio detector filter for developing, during said certain interval and in response to said amplitude-modulated intermediate-frequency signal, an audio signal representing the audio information carried by said first carrier wave, and further including an automatic gain control filter for developing a D.C. control potential of a magnitude determined by the average peak amplitude of said amplitude-modulated intermediate-frequency signal;

a capacitor coupling said second parallel resonant tuned circuit to said diode for applying, during said other interval, said frequency-modulated intermediate-frequency signal with substantially said same predetermined peak amplitude to said amplitude modulation detector to produce in said automatic gain control filter a D.C. control potential of a magnitude determined by the average peak amplitude of said frequency-modulated intermediate-frequency signal, said capacitor presenting a relatively high impedance at said predetermined intermediate frequency to effectively decouple said second tuned circuit from said amplitude modulation detector during the reception of said first carrier wave;

and means for utilizing said D.C. control potentials to automatically control the gain of said radio receiver.

5. A plural wave band, superheterodyne radio receiver for utilizing a first carrier wave amplitude-modulated with audio information and having a carrier frequency lying within a first wave band, and for also utilizing a second carrier wave frequency-modulated with audio information and having a carrier frequency lying within a second wave band above said first wave band in the frequency spectrum, comprising:

a first amplifying channel including a first parallel resonant tuned circuit to constitute, during a certain interval and in response to the reception of said first carrier wave, a first signal source providing an amplitude-modulated intermediate-frequency signal having a predetermined intermediate frequency and having a peak amplitude determined by the strength of said first carrier wave;

a second amplifying channel including a second parallel resonant tuned circuit to constitute, during another interval and in response to the reception of said second carrier wave, a second signal source porviding a frequency-modulated intermediate-frequency signal having an intermediate frequency which is higher than said predetermined intermediate frequency and having a predetermined peak amplitude determined by the strength of said second carrier wave;

an amplitude modulation detector, including only one unidirectional conductive device, coupled to said first signal source and including an audio output circuit for developing, during said certain interval and in response to said amplitude-modulated intermediate-frequency signal, a first audio signal representing the audio information carried by said first carrier wave, and including a filter network for developing a D.C. control potential of a magnitude determined by the average peak amplitude of said amplitude-modulated intermediate-frequency signal;

means, including a capacitor, coupling said second signal source to said unidirectional conductive device for applying, during said other interval, said frequency-modulated intermediate-frequency signal with substantially said same predetermined peak amplitude to said amplitude modulation detector to produce in said filter network a D.C. control potential of a magnitude determined by the average peak amplitude of said frequency-modulated intermediate-frequency signal, said capacitor presenting a relatively high impedance at said predetermined intermediate frequency to effectively decouple said second parallel resonant tuned circuit from said amplitude modulation detector during the reception of said first carrier wave;

means including only passive elements for utilizing said D.C. control potentials to automatically control the gain of said radio receiver;

a frequency modulation detector coupled to said second signal source for developing, during said other interval and in response to said frequency-modulated intermediate-frequency signal, a second audio signal representing the audio information carried by said second carrier wave;

and switching means coupled to said audio output circuit and to said frequency modulation detector for selecting said first audio signal during said certain interval and said second audio signal during said other interval.

6. A plural wave band, superheterodyne radio receiver for utilizing a first carrier wave amplitude-modulated with audio information and having a carrier frequency lying within a first wave band, and for also utilizing a second carried wave frequency-modulated with audio information and having a carrier frequency lying within a second wave band above said first wave band in the frequency spectrum, comprising:

a first amplifying channel including a first parallel resonant tuned circuit across which is developed, during a certain interval and in response to the reception of said first carrier wave, an amplitude-modulated intermediate-frequency signal having a predetermined intermediate frequency and having a peak amplitude determined by the strength of said first carrier wave;

a second amplifying channel including a second parallel resonant tuned circuit across which is developed, during another interval and in response to the reception of said second carrier wave, a frequency-modulated intermediate-frequency signal having an intermediate frequency which is higher than said predetermined intermediate frequency and having a predetermined peak amplitude determined by the strength of said second carrier wave;

an amplitude modulation detector including a two-terminal unidirectional conductive device, to one terminal of which is connected a resistance-capacitance audio detection filter and also a resistance-capacitance automatic gain control filter;

means for coupling said first parallel resonant tuned circuit to said amplitude modulation detector to develop in said audio detection filter, during said certain interval and in response to said amplitude-modulated intermediate-frequency signal, an audio signal representing the audio information carried by said first carrier wave, and to develop in said automatic gain control filter a D.C. control potential of a magnitude determined by the average peak amplitude of said amplitude-modulated intermediate-frequency signal;

a capacitor, coupling said second parallel resonant tuned circuit to said unidirectional conductive device for applying, during said other interval, said frequency-modulated intermediate-frequency signal will substantially said same predetermined peak amplitude to said amplitude modulation detector to produce in said automatic gain control filter a D.C. control potential of a magnitude determined by the average peak amplitude of said frequency-modulated intermediate-frequency signal, said capacitor presenting a relatively high impedance at said predetermined intermediate frequency to effectively decouple said second tuned circuit from said amplitude modulation detector during the reception of said first carrier wave;

and means for utilizing said D.C. control potentials to automatically control the gain of said radio receiver.

7. A plural wave band, superheterodyne radio receiver for utilizing a first carrier wave amplitude-modulated with audio information and having a carrier frequency lying within a first wave band, and for also utilizing a second carrier wave frequency-modulated with audio information and having a carrier frequency lying within a second wave band above said first wave band in the frequency spectrum, comprising:

means for developing, during a certain interval and in response to the reception of said first carrier wave, an amplitude-modulated intermediate-frequency signal having a predetermined intermediate frequency and having a peak amplitude determined by the strength of said first carrier wave, and for developing, during another interval and in response to the reception of said second carrier wave, a frequency-modulated intermediate-frequency signal having an intermediate frequency which is higher than said predetermined intermediate frequency and having a peak amplitude determined by the strength of said second carrier wave;

an intermediate-frequency amplifying stage comprising an active amplifying device having input, output and common terminals, means connecting said input and common terminals to said developing means, and an output load circuit connected across said common and output terminals and including a first inductance-capacitance parallel resonant tuned circuit across which is developed an amplified version of said amplitude-modulated intermediate-frequency signal and a second second inductance-capacitance parallel resonant tuned circuit across which is developed an amplified version of said frequency-modulated intermediate-frequency signal, at least a portion of said first tuned circuit being coupled in series with at least a portion of said second tuned circuit;

an amplitude modulation detector including a two-terminal unidirectional conductive device, to one terminal of which is connected an audio output circuit and also a filter network;

means including an inductance coil for inductively coupling said first tuned circuit to the other terminal of said unidirectional conductive device to develop in said audio output circuit, during said other interval and in response to the amplified version of said amplitude-modulated intermediate-frequency signal, an audio signal representing the audio information carried by said first carrier wave, and to develop in said filter network a D.C. control potential of a magnitude determined by the average peak amplitude of said amplitude-modulated intermediate-frequency signal;

a capacitor connected between said output terminal of said amplifying device and said one terminal of said unidirectional conductive device for coupling said second parallel resonant tuned circuit to said amplitude modulation detector to apply, during said other interval, substantially the entire frequency-modulated intermediate-frequency signal developed across said second tuned circuit to said amplitude modulation detector to produce in said filter network a D.C. control potential of a magnitude determined by the average peak amplitude of said frequency-modulated intermediate-frequency signal, said capacitor presenting a relatively high impedance at said predetermined intermediate frequency to effectively decouple said second tuned circuit from said amplitude modulation detector during the reception of said first carrier wave, the impedance reflected from said first tuned circuit to said inductance coil during the reception of said second carrier wave being such that said inductance coil presents a relatively low impedance at the intermediate frequency of said frequency-modulated intermediate-frequency signal;

and means for utilizing said D.C. control potentials to automatically control the gain of said radio receiver.

References Cited by the Examiner

UNITED STATES PATENTS 3,172,040 3/1965 Schultz ----------- 325—317 X

KATHLEEN H. CLAFFY, *Primary Examiner.*

R. LINN, *Assistant Examiner.*